United States Patent
Deng et al.

(10) Patent No.: US 12,399,232 B2
(45) Date of Patent: Aug. 26, 2025

(54) ISOLATION FOREST-BASED MODULAR MULTILEVEL CONVERTER OPEN-CIRCUIT FAULT DIAGNOSIS METHOD DEVICES

(71) Applicant: SOUTHEAST UNIVERSITY, Jiangsu (CN)

(72) Inventors: Fujin Deng, Jiangsu (CN); Yufei Chen, Jiangsu (CN); Chengkai Liu, Jiangsu (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 18/561,221

(22) PCT Filed: Jan. 31, 2023

(86) PCT No.: PCT/CN2023/073937
§ 371 (c)(1),
(2) Date: Nov. 15, 2023

(87) PCT Pub. No.: WO2023/169098
PCT Pub. Date: Sep. 14, 2023

(65) Prior Publication Data
US 2024/0255584 A1    Aug. 1, 2024

(30) Foreign Application Priority Data
Mar. 10, 2022  (CN) .......................... 202210234148.6

(51) Int. Cl.
*G01R 31/54* (2020.01)
*H02M 7/483* (2007.01)

(52) U.S. Cl.
CPC ............ *G01R 31/54* (2020.01); *H02M 7/483* (2013.01)

(58) Field of Classification Search
CPC ..... G01R 31/54; G01R 31/3004; H02M 1/32; H02M 7/483
See application file for complete search history.

(56) References Cited

U.S. PATENT DOCUMENTS 9,989,586 B2 * 6/2018 Liu ....................... H02M 7/487
12,276,707 B2 * 4/2025 Rojko ................... H02M 7/538
(Continued)

FOREIGN PATENT DOCUMENTS

CN    110719044 A    1/2020
CN    110988742 A    4/2020
(Continued)

*Primary Examiner* — Arleen M Vazquez
(74) *Attorney, Agent, or Firm* — Muncy, Geissler, Olds & Lowe, P.C.

(57) ABSTRACT

The present invention discloses an isolation forest (IF)-based modular multilevel converter (MMC) open-circuit (OC) fault diagnosis method, including the following steps: sampling capacitor voltages of submodules (SM), constructing an isolation tree (IT) according to capacitor voltage data, and calculating a depth of each SM in the IT; and forming an IF based on the ITs, calculating average depths of the SMs in the IF, taking an SM with the minimum average depth as an output of the IT, and finally locating a faulty SM by an output buffer to realize accurate location of the faulty SM. Only capacitor voltages of SMs are involved, and no extra hardware resources are required. System parameters are not involved, construction of a system mathematical model and manual setting of an empirical threshold are not required, and the robustness is high. Faults are located using sparsity and difference of abnormal data based on unsupervised learning, mass data analysis and sample training are not required, and the method has the advantages of linear time complexity, small data volume, simple calculation process, low calculation cost, and the like.

10 Claims, 3 Drawing Sheets

(56) References Cited

U.S. PATENT DOCUMENTS

2020/0210854 A1    7/2020  Srinivasan et al.
2021/0384816 A1* 12/2021  Xiao .................. H02M 7/4835

FOREIGN PATENT DOCUMENTS

| | | | | |
|---|---|---|---|---|
| CN | 111707973 A | 9/2020 | | |
| CN | 112348071 A | 2/2021 | | |
| CN | 113341345 A | 9/2021 | | |
| CN | 113420073 A | 9/2021 | | |
| CN | 113762350 A | 12/2021 | | |
| CN | 114609546 A | 6/2022 | | |
| EP | 3923432 A1 * | 12/2021 | ............ | H02M 1/327 |
| WO | WO-2022/043872 A1 | 3/2022 | | |

* cited by examiner

ISOLATION FOREST-BASED MODULAR MULTILEVEL CONVERTER OPEN-CIRCUIT FAULT DIAGNOSIS METHOD DEVICES

TECHNICAL FIELD

The present invention relates to the technical field of multilevel power electronic converters, and in particular, to an isolation forest (IF)-based modular multilevel converter (MMC) open-circuit (OC) fault diagnosis method.

BACKGROUND

With the continuous development and progress of modern science and technology, an MMC is more suitable for high-voltage and high-power application scenarios since the MMC is characterized by high efficiency, low harmonic output alternating current voltage, low switching frequency, high redundancy, high modularity, and flexible operation, and has broad application prospects in flexible direct current transmission, high-power motor drive, and other fields.

The MMC is composed of a large number of submodules (SM) cascaded. By dividing a large direct current capacitor into smaller capacitors, the series SMs may be applied in the MMC. The unique structure determines that the MMC has no large-capacity direct current capacitor, low switching synchronization demand, and high modularization degree. However, a large number of series SMs pose a great threat to the reliability of the MMC since each SM is a potential fault point of the MMC and the stable operation and equipment safety of an MMC system will be seriously affected once in the occurrence of faults.

The reliable operation of the MMC is one of the keys of the technology research. SM faults are the main sources of MMC faults and include two main types: an SM OC fault and an SM short-circuit (SC) fault. The SC fault is destructive, and therefore, an SM drive circuit is generally equipped with an SC protection module. In the occurrence of the SC fault, the SM is locked locally to ensure the normal operation of the system. The OC fault is relatively less harmful. Therefore, it is less likely to detect the fault immediately. As a result, voltage and current waveform distortions and other consequences will be caused, thereby threatening the normal operation of the system. The SM OC fault diagnosis usually requires fault detection and fault location. In fault detection, an error alarm is generated to inform the SM of the occurrence of the SM OC fault. In order to realize the uninterrupted operation of the MMC in the occurrence of the SM OC fault, a faulty SM will be identified by fault location to ensure correct topology configuration.

At present, multiple fault detection and location methods have been put forward in academic circles. A hardware-based method refers to: locating SM faults by using an integrated monitoring sensor and providing a drive module with a fault detection function. However, according to the hardware-based method, additional fault detection circuits are required, thus not only increasing the cost, but also bringing new potential fault points. An observer-based method refers to: detecting faults by an observer based on a Kalman filter and locating the faults by comparison of capacitor voltages. According to the method for fault detection and fault location based on a sliding mode observer, construction of an accurate mathematical model of an MMC system and manual setting of an empirical threshold are required. According to an artificial intelligence-based method, for example, a fault detection and location method based on a sliding time window and a convolutional neural network, mass data analysis and sample training are required, the calculation process is complex, and the calculation amount is large.

SUMMARY

An object of the present invention is to provide an IF-based MMC OC fault diagnosis method, which solves the foregoing technical problem and also realizes SM OC fault detection and location without extra hardware resources.

The object of the present invention may be achieved by the following technical solution:

The IF-based MMC OC fault diagnosis method includes the following steps:

step 1: sampling an infinite flow signal of a capacitor voltage of an MMC over time at a sampling frequency of $f_s$ and a sampling interval of $T_s$;

step 2: constructing, based on capacitor voltage data sampled at each time, an isolation tree (IT) for the capacitor voltage data of a bridge arm;

step 3: calculating a depth D(i) of each SM SMi in the IT based on the constructed IT;

step 4: taking $T_s$ as one sampling time, forming an IF based on m ITs constructed at m consecutive sampling times, and calculating an average depth AD(i) of each SM SMi in the IF;

step 5: denoting a serial number i of an SM with a minimum average depth AD(i) in the IF, serving as a current output of the IF, as an IFO, and orderly storing in an output buffer capable of accommodating k IFOs; and step 6: outputting an SM fault location flag Flag according to a condition of the output buffer, and determining whether there is a fault.

Further, the IT is a nonlinear data structure with a certain number of layers for classifying the SMs according to a capacitor voltage magnitude relationship between the SMs.

The method for constructing the IT includes: randomly selecting, in response to a root node $N_0$ at layer 0 including n SMs of a bridge arm and corresponding n capacitor voltage values, a voltage division value $u_0$ starting from the root node, classifying SMs with the capacitor voltage less than or equal to $u_0$ into node $N_{1\_1}$, and classifying SMs with the capacitor voltage greater than $u_0$ into node $N_{1\_2}$; and repeatedly performing the foregoing process on $N_{1\_1}$, $N_{1\_2}$, and following nodes N, and completing construction of one IT in a case that all nodes are not indivisible, where the IT includes n indivisible terminal nodes (TN) each including only one SM represented as TN(SMi), SMi corresponding to an $i^{th}$ SM in the bridge arm, $1 \le i \le n$.

Further, the sampling frequency $f_s$ is equal to 100 kHz and the sampling interval $T_s$ is equal to 1 ms in step 1.

Further, the depth D(i) in step 3 is defined as: a calculation formula for the number of layers of a TN corresponding to the SM SMi in the IT is:

$$D(i) = IT[\text{Level}(TN(SMi))].$$

Further, m is equal to 100 in step 4.

Further, a calculation formula for the average depth AD(i) of each SM SMi in m ITs in step 4 is:

$$AD(i) = \frac{1}{m}\sum_{j=1}^{m} D(i, j)$$

where D(i,j) represents a depth of a TN corresponding to an SM SMi in a $j^{th}$ ($1 \leq j \leq m$) IT of the IF.

Further, k is equal to 5 in step 5.

Further, a working mode of the output buffer in step 5 is: updating data in the output buffer at an interval of $mT_s$ once, deleting an IFO generated at the earliest, and also adding an IFO generated newly.

Further, the SMs have a half-bridge structure, including two power switches $S_u$ and $S_l$, two diodes $D_u$ and $D_l$, and a direct current capacitor C, the power switch $S_u$ and the diode $D_u$ forming an upper tube, and the power switch $S_l$ and the diode $D_l$ forming a lower tube. A cathode of the diode $D_u$ is connected to a collector of the power switch $S_u$, and an anode of the diode $D_u$ is connected to an emitter of the power switch $S_u$. A cathode of the diode $D_l$ is connected to a collector of the power switch $S_l$, and an anode of the diode $D_l$ is connected to an emitter of the power switch $S_l$. The emitter of the power switch $S_u$ and the collector of the power switch $S_l$ are connected to a current inflow side of an SM bridge arm respectively. A gate of the power switch $S_u$ and a gate of the power switch $S_l$ are connected to a control circuit for controlling on and off of the power switches respectively. The emitter of the power switch $S_l$ is connected to a current outflow side of the SM bridge arm, and the collector of the power switch $S_u$ is connected to the current outflow side of the SM bridge arm via the direct current capacitor.

Further, a specific fault determining method in step 6 includes:

determining, if all IFOs in the output buffer are identical, a corresponding SM SMi as a faulty SM in a case that Flag=1; and otherwise, determining that a system is normal in a case that Flag=0, and repeatedly performing steps 1-5 to continue detecting the system.

The present invention has the following beneficial effects:

1. According to the converter OC fault diagnosis method provided by the present invention, fault detection and location can be realized simultaneously, and the practical value is high. The problems of complex fault diagnosis process and long fault diagnosis time caused by separating OC fault detection and location in a traditional SM OC fault diagnosis algorithm are solved.
2. According to the OC fault diagnosis method of the present invention, system parameters are not involved, and construction of a system mathematical model and manual setting of an empirical threshold are not required. Therefore, the method is not affected by the uncertainty of the system parameters, and has high robustness.
3. The OC fault diagnosis method of the present invention is not required to modify a hardware circuit in any way, does not increase extra hardware cost, and is easy to implement.
4. According to the OC fault diagnosis method of the present invention, circulating current is not introduced into the system, and output characteristics of the system are not changed.
5. According to the OC fault diagnosis method of the present invention, faults are located using sparsity and difference of abnormal data based on unsupervised learning, mass data analysis and sample training are not required, and the method has the advantages of linear time complexity, small data volume, simple calculation process, low calculation cost, and the like.

BRIEF DESCRIPTION OF THE DRAWINGS

The following further describes the present invention in detail with reference to the accompanying drawings.

DETAILED DESCRIPTION

The following clearly and completely describes the technical solutions in the embodiments of the present invention with reference to the accompanying drawings in the embodiments of the present invention. Apparently, the described embodiments are some of the embodiments of the present invention rather than all of the embodiments. All other embodiments obtained by a person of ordinary skill in the art based on the embodiments of the present invention without creative efforts shall fall within the protection scope of the present invention.

Figure 1:
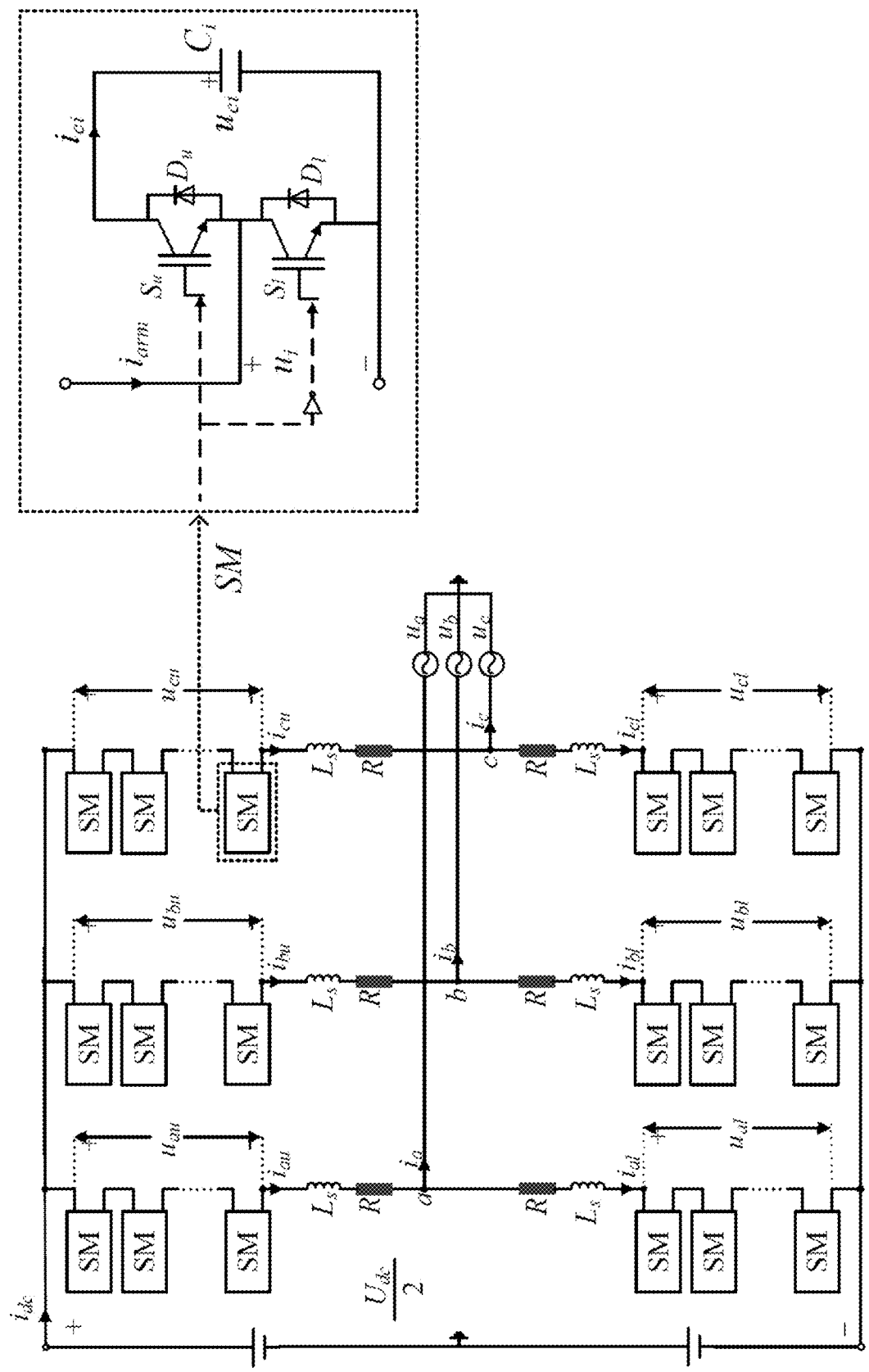
FIG. 1 is a topological structure diagram of a three-phase MMC and SMs in the present invention.

Aiming at the problem of SM OC faults, the present invention provides an SM fault diagnosis method suitable for an MMC. A topological structure of the MMC is composed of six bridge arms. As shown in FIG. 1, each bridge arm includes n identical SMs and a bridge arm inductor $L_s$. The SMs adopt a half-bridge structure. Each SM is composed of two power switches $S_u$ and $S_l$, two diodes $D_u$ and $D_l$, and a direct current capacitor C.

A capacitor voltage balance method includes: comparing a bridge arm reference voltage with a carrier wave to obtain p SMs to be put onto one bridge arm, when the current of the bridge arm is greater than 0, putting the p SMs with the lowest capacitor voltage, and when the current of the bridge arm is less than 0, putting the p SMs with the highest capacitor voltage.

Figure 2:
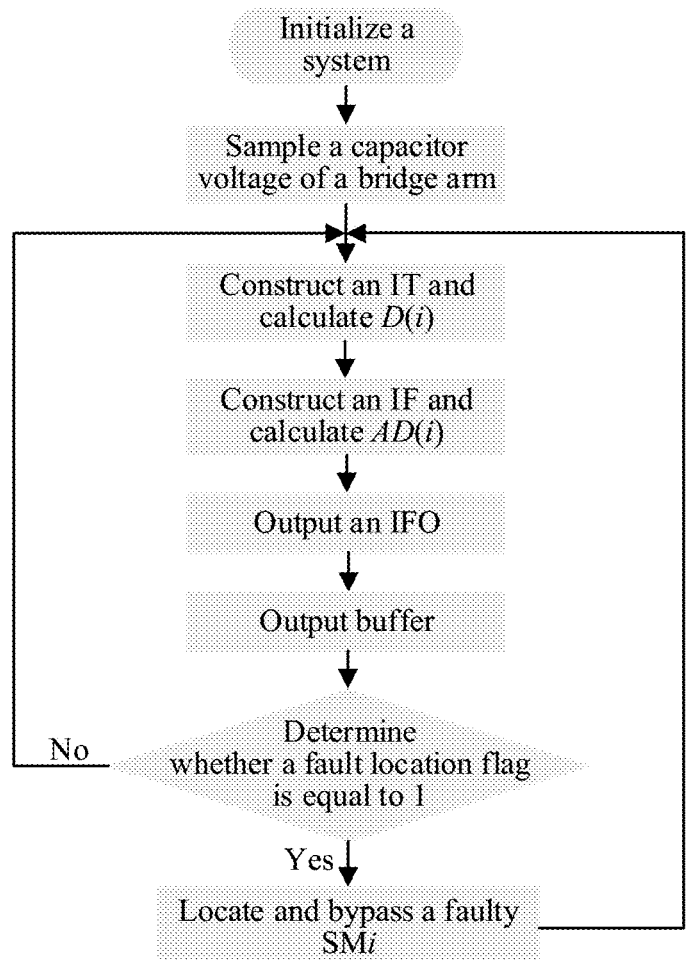
FIG. 2 is a flowchart of a specific implementation of a fault diagnosis method according to the present invention.
Figure 3:
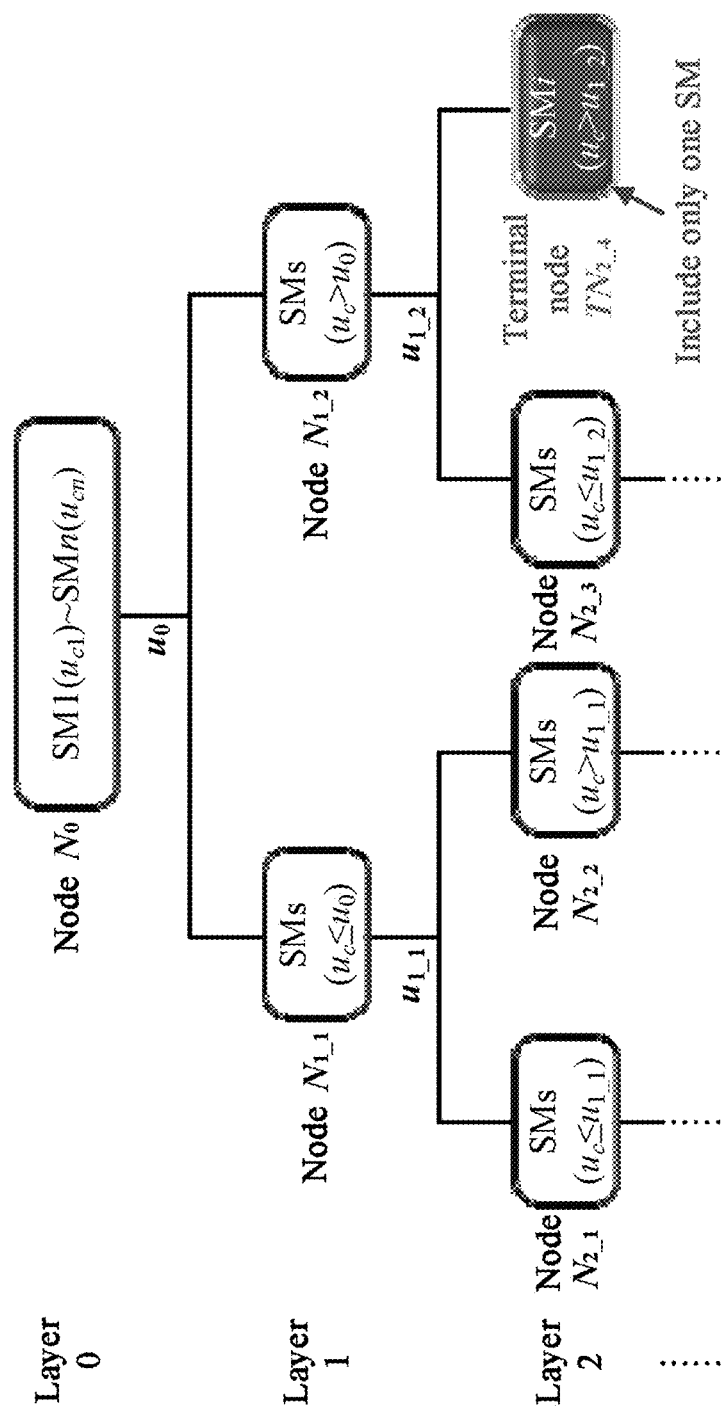
FIG. 3 is an example diagram of an IT constructed in the present invention.

As shown in FIG. 2, an IF-based MMC OC fault diagnosis method includes: sampling capacitor voltages of SMs, constructing an IT for describing data features of the capacitor voltages of the SMs according to capacitor voltage data sampled at each time, and calculating a depth of each SM in the IT; and forming an IF based on the constructed ITs, calculating an average depth of each SM in the IF, taking an SM with the minimum average depth as a current output of the IT, and finally locating a faulty SM by an output buffer to realize accurate location of the faulty SM within a short time. The method specifically includes the following steps:

(1) Sample an infinite flow signal of a capacitor voltage of an MMC over time at a sampling frequency of $f_s$ and a sampling interval of $T_s$ (for example, $f_s$=100 kHz, and $T_s$=1 ms).

(2) Construct an IT for a bridge arm based on capacitor voltage data sampled at each time, where the IT is a nonlinear data structure with a certain number of layers for classifying SMs according to a capacitor voltage magnitude relationship between the SMs.

The method for constructing the IT includes: randomly selecting, in response to a root node $N_0$ at layer 0 including n SMs of a bridge arm and corresponding n capacitor voltage values, a voltage division value $u_0$ (between a maximum capacitor voltage and a minimum capacitor voltage of the SM at a current time) starting from the root node, classifying SMs with the capacitor voltage less than or equal to $u_0$ into node $N_{1\_1}$, and classifying SMs with the capacitor voltage greater than $u_0$ into node $N_{1\_2}$; and repeatedly performing the foregoing process on $N_{1\_1}$, $N_{1\_2}$, and following nodes N, and completing construction of one IT in a case that all nodes are not indivisible, where the IT includes n indivisible TNs each including only one SM represented as TN(SMi), SMi corresponding to an $i^{th}$ SM in the bridge arm, $1 \leq i \leq n$.

(3) Calculate a depth D(i) of each SM SMi in the IT based on the constructed IT.

(4) Take $T_s$ as one sampling time, form an IF based on m ITs (for example, m=100) constructed at m consecutive sampling times, and calculate an average depth AD(i) of each SM SMi in the IF.

(5) Denote a serial number i of an SM with a minimum average depth AD(i) in the IF, serving as a current output of the IF, as an IFO, and orderly store in an output buffer capable of accommodating k IFOs (for example, k=5).

(6) Output an SM fault location flag Flag according to a condition of the output buffer, and determine whether there is a fault.

SM OC fault criteria are as follows: determining, if all IFOs in the output buffer are identical, a corresponding SM SMi as a faulty SM in a case that Flag=1; and otherwise, determining that the system is normal and the SM works normally without an OC fault, in a case that Flag=0.

The present invention is especially suitable for an MMC system with a large number of SMs. Compared with a traditional SM fault diagnosis method, the present invention can significantly reduce the calculation amount of a diagnosis algorithm. With the method provided, the capacitor voltage is analyzed, and fault diagnosis is performed by using sparsity and difference of abnormal capacitor voltage data. When an SM has an OC fault, the capacitor voltage of the faulty SM will change differently from that of a normal SM. Therefore, the capacitor voltage change is monitored in the method provided. Since only the capacitor voltage is involved, no extra hardware resources are required and no extra hardware cost is increased according to the method provided. Since system parameters are not involved, construction of a system mathematical model and manual setting of an empirical threshold are not required. Therefore, the method is not affected by the uncertainty of the system parameters, and has high robustness. Compared with other artificial intelligence-based methods, the method is based on unsupervised learning, mass data analysis and sample training are not required, and the method has the advantages of linear time complexity, small data volume, simple calculation process, low calculation cost, and the like.

In the descriptions of this specification, a description of a reference term such as "an embodiment", "an example", or "a specific example" means that a specific feature, structure, material, or characteristic that is described with reference to the embodiment or the example is included in at least one embodiment or example of the present invention. In this specification, exemplary descriptions of the foregoing terms do not necessarily refer to the same embodiment or example. In addition, the described specific features, structures, materials, or characteristics may be combined in a proper manner in any one or more of the embodiments or examples.

The foregoing displays and describes basic principles, main features of the present invention and advantages of the present invention. A person skilled in the art may understand that the present invention is not limited to the foregoing embodiments. Descriptions in the embodiments and this specification only illustrate the principles of the present invention. Various modifications and improvements are made in the present invention without departing from the spirit and the scope of the present invention, and these modifications and improvements shall fall within the protection scope of the present invention.

What is claimed is:

1. An isolation forest (IF)-based modular multilevel converter (MMC) open-circuit (OC) fault diagnosis method, comprising the following steps:

step 1: sampling an infinite flow signal of a capacitor voltage of an MMC over time at a sampling frequency of $f_s$ and a sampling interval of $T_s$;

step 2: constructing, based on capacitor voltage data sampled at each time, an isolation tree (IT) for the capacitor voltage data of a bridge arm;

step 3: calculating a depth D(i) of each submodule (SM) SMi in the IT based on the constructed IT;

step 4: taking $T_s$ as one sampling time, forming an IF based on m ITs constructed at m consecutive sampling times, and calculating an average depth AD(i) of each SM SMi in the IF;

step 5: denoting a serial number i of an SM with a minimum average depth AD(i) in the IF, serving as a current output of the IF, as an IFO, and orderly storing in an output buffer capable of accommodating k IFOs; and step 6: outputting an SM fault location flag Flag according to a condition of the output buffer, and determining whether there is a fault.

2. The IF-based MMC OC fault diagnosis method according to claim 1, wherein the IT is a nonlinear data structure with a certain number of layers for classifying the SMs according to a capacitor voltage magnitude relationship between the SMs; and the method for constructing the IT comprises: randomly selecting, in response to a root node $N_0$ at layer 0 comprising n SMs of a bridge arm and corresponding n capacitor voltage values, a voltage division value $u_0$ starting from the root node, classifying SMs with the capacitor voltage less than or equal to $u_0$ into node $N_{1\_1}$, and classifying SMs with the capacitor voltage greater than $u_0$ into node $N_{1\_2}$; and repeatedly performing the foregoing process on $N_{1\_1}$, $N_{1\_2}$, and following nodes N, and completing construction of one IT in a case that all nodes are not indivisible, wherein the IT comprises n indivisible terminal nodes (TN) each comprising only one SM represented as TN(SMi), SMi corresponding to an $i^{th}$ SM in the bridge arm, $1 \leq i \leq n$.

3. The IF-based MMC OC fault diagnosis method according to claim 1, wherein the sampling frequency $f_s$ is equal to 100 kHz and the sampling interval $T_s$ is equal to 1 ms in step 1.

4. The IF-based MMC OC fault diagnosis method according to claim 1, wherein the depth D(i) in step 3 is defined as: a calculation formula for the number of layers of a TN corresponding to the SM SMi in the IT is:

$$D(i) = IT[\text{Level}(TN(SMi))].$$

5. The IF-based MMC OC fault diagnosis method according to claim 1, wherein m is equal to 100 in step 4.

6. The IF-based MMC OC fault diagnosis method according to claim 5, wherein a calculation formula for the average depth AD(i) of each SM SMi in m ITs in step 4 is:

$$AD(i) = \frac{1}{m}\sum_{j=1}^{m} D(i, j)$$

wherein D(i, j) represents a depth of a TN corresponding to an SM SMi in a $j^{th}$ (1≤j≤m) IT of the IF.

7. The IF-based MMC OC fault diagnosis method according to claim 1, wherein k is equal to 5 in step 5.

8. The IF-based MMC OC fault diagnosis method according to claim 1, wherein a working mode of the output buffer in step 5 is: updating data in the output buffer at an interval of $mT_s$ once, deleting an IFO generated at the earliest, and also adding an IFO generated newly.

9. The IF-based MMC OC fault diagnosis method according to claim 1, wherein the SMs have a half-bridge structure, comprising two power switches $S_u$ and $S_l$, two diodes $D_u$ and $D_l$, and a direct current capacitor C, the power switch $S_u$ and the diode $D_u$ forming an upper tube, and the power switch $S_l$ and the diode $D_l$ forming a lower tube; and a cathode of the diode $D_u$ is connected to a collector of the power switch $S_u$, an anode of the diode $D_u$ is connected to an emitter of the power switch $S_u$, a cathode of the diode $D_l$ is connected to a collector of the power switch $S_l$, an anode of the diode $D_l$ is connected to an emitter of the power switch $S_l$, the emitter of the power switch $S_u$ and the collector of the power switch $S_l$ are connected to a current inflow side of an SM bridge arm respectively, a gate of the power switch $S_u$ and a gate of the power switch $S_l$ are connected to a control circuit for controlling on and off of the power switches respectively, the emitter of the power switch $S_l$ is connected to a current outflow side of the SM bridge arm, and the collector of the power switch $S_u$ is connected to the current outflow side of the SM bridge arm via the direct current capacitor.

10. The IF-based MMC OC fault diagnosis method according to claim 1, wherein a specific fault determining method in step 6 comprises:

determining, if all IFOs in the output buffer are identical, a corresponding SM SMi as a faulty SM in a case that Flag=1; and otherwise, determining that a system is normal in a case that Flag=0, and repeatedly performing steps 1-5 to continue detecting the system.

\* \* \* \* \*